(12) United States Patent
Yagi

(10) Patent No.: US 6,683,897 B2
(45) Date of Patent: Jan. 27, 2004

(54) SEMICONDUCTOR LASER DEVICE

(75) Inventor: Ayumi Yagi, Yamatotakada (JP)

(73) Assignee: Sharp Kabushiki Kaisha, Osaka (JP)

( * ) Notice: Subject to any disclaimer, the term of this patent is extended or adjusted under 35 U.S.C. 154(b) by 168 days.

(21) Appl. No.: 09/993,544

(22) Filed: Nov. 27, 2001

(65) Prior Publication Data

US 2002/0075915 A1 Jun. 20, 2002

(30) Foreign Application Priority Data

Nov. 28, 2000 (JP) ........................................ 2000-361019

(51) Int. Cl.[7] ............................................... H01S 3/042
(52) U.S. Cl. ......................................... 372/32; 372/109
(58) Field of Search ..................... 372/36, 109; 438/24, 438/26, 27

(56) References Cited

U.S. PATENT DOCUMENTS 4,351,051 A * 9/1982 van Alem .................... 372/36
4,567,598 A * 1/1986 Noguchi ...................... 372/36
5,052,009 A * 9/1991 Tsuboi ......................... 372/36

FOREIGN PATENT DOCUMENTS

JP 6-5990 A 1/1994
JP 10-256649 A 9/1998

* cited by examiner

Primary Examiner—James Davie
(74) Attorney, Agent, or Firm—Nixon & Vanderhye P.C.

(57) ABSTRACT

Provided is a semiconductor laser device capable of being easily accurately mounted on the mounting portion of an optical pickup device. A semiconductor laser element is mounted on a side surface of a heat sink of a base via a submount, and a light-receiving element is mounted on an upper surface of the heat sink. A stem constructed by arranging two resin lead blocks on both sides of the base is covered with a cap, and a hologram element is arranged in an opening provided at an upper surface of the cap. Skirt portions constructed by partially extending peripheral surfaces of a long side of the cap are inserted into recess portions of the stem, and tip portions of projections projecting in the recess portions and inner surfaces of the skirt portions are joined to each other by resistance welding.

10 Claims, 11 Drawing Sheets

SEMICONDUCTOR LASER DEVICE

BACKGROUND OF THE INVENTION

The present invention relates to a semiconductor laser device to be employed as a light source or the like of an optical pickup device for reading the data of, for example, CD-ROM (compact disc read only memory), DVD (digital versatile disc) or the like.

As a semiconductor laser device of this kind, there is the one shown in FIG. 8A (Japanese Patent Laid-Open Publication No. HEI 6-5990). This semiconductor laser device is the semiconductor laser device of a hologram laser system. As shown in the exploded perspective view of FIG. 8B, in this semiconductor laser device 100, a heat sink 102 is formed integrally with a base 101, and a semiconductor laser element 105 is mounted on a side surface of this heat sink 102 via a submount 104 for heat radiation. A light-receiving element 107 for signal detection use is mounted on the upper surface of the heat sink 102. A plurality of leads 108 are each fixed to the base 101 while being electrically insulated by hermetic seals 109. Pads (not shown) of the semiconductor laser element 105 and the light-receiving element 107 are connected by wire bonding (not shown) to inner leads 108a, which are the portions that belong to the leads 108 and protrude on the heat sink side of the base 101. Then, the heat sink 102, the semiconductor laser element 105, the light-receiving element 107 and the inner leads 108a, which are located on the base 101, are covered with a cap 110, and a hologram element 112 is fitted in an opening window 110a opened in a position that belongs to this cap 110 and is facing the semiconductor laser element 105.

FIG. 9A is a perspective view showing a prior art semiconductor laser device (Japanese Patent Laid-Open Publication No. HEI 6-5990), while FIG. 9B is an exploded perspective view of this semiconductor laser device. For the semiconductor laser device shown in FIGS. 9A and 9B, the portions that have the same functions as those of the semiconductor laser device shown in FIG. 8 are denoted by the same reference numerals, and no detailed description is provided for the portions. The semiconductor laser device 120 of FIGS. 9A and 9B differs from the semiconductor laser device 100 shown in FIGS. 8A and 8B only in that the base and the cap have different shapes. In this semiconductor laser device 120, the base 101 and the cap 110 are roughly elliptic in shape, where two opposed bow-shaped portions are removed from a circular shape, and this device has a width smaller than that of the semiconductor laser device 100 of FIG. 8. If this semiconductor laser device 120 is mounted with the widthwise direction thereof directed in the direction of thickness of the optical pickup device, then an optical pickup device that has a small thickness can be provided.

The semiconductor laser device shown in FIGS. 10A, 10B and 11 (refer to Japanese Patent Laid-Open Publication No. HEI 10-256649) differs from the semiconductor laser device 100 shown in FIGS. 8A and 8B in the structure of connecting wiring leads to the base. In FIGS. 10A and 10B, the portions that have the same functions as those of the semiconductor laser device of FIGS. 8A and 8B are denoted by the same reference numerals. As shown in FIG. 10B, this semiconductor laser device 125 has resin lead blocks 127 and 127 in which leads 108 are partially implanted. The resin lead blocks 127 and 127 are fixed by ultrasonic welding onto both sides of a base 101 on which the semiconductor laser element 105 and the light-receiving element 107 are mounted, forming a stem 128. Then, a cap 110 is fixed to this stem 128 so as to cover the semiconductor laser element 105, and a hologram element 112 is arranged in an opening window 110a provided on the upper surface of this cap 11, forming a semiconductor laser device 125.

This semiconductor laser device 125 is not required to insulate and fix a plurality of leads 108 to the base 101 each via the hermetic seals 109, dissimilarly to the semiconductor laser device 100 shown in FIGS. 8A and 8B, and therefore, the semiconductor laser device 125 can easily be assembled.

In each of the semiconductor laser devices 100, 120 and 125 shown in FIGS. 8A through 11, the cap 110 is provided with a flange portion 110b, and this flange portion 110b is resistance-welded to the end surface of the base 101, fixing the cap 110 to the base 101. The end surface of the base 101 to which the flange portion 101b is welded has a mounting reference surface 101a for mounting each of these semiconductor laser devices 100, 120 and 125 on the mounting portion of the optical pickup device in a portion other than the portion to which the flange portion 110b of the cap is welded.

FIG. 12 is a view showing an optical pickup device that employs the semiconductor laser device 120 shown in FIG. 9. It is to be noted that optical pickup devices that employ the semiconductor laser devices 110 and 125 shown in FIGS. 8 and 10 also have the same construction as that of the semiconductor laser device of FIG. 12.

In this optical pickup device, the semiconductor laser device 120 mounted on a mounting plate 132, a collimator lens 133, a mirror 134 and an object lens 136 mounted on an actuator (not shown) are assembled with an assembly plate 131. The semiconductor laser device 120 is mounted on the mounting plate 132 with the mounting reference surface 101a fit close to the mounting surface 132a of the mounting plate 132.

The above-mentioned optical pickup device operates as follows. Laser light emitted from the semiconductor laser device 120 is split into three beams by a diffraction grating provided in the hologram element 112, and these three beams are reflected on the mirror 134 and condensed onto an optical disk 138 by means of the object lens 136. Return light from the optical disk 138 passes through a path identical to that of the emitted beam and returns to the semiconductor laser device 120. The return light that has returned to the semiconductor laser device 120 is diffracted by the hologram pattern of the hologram element 112 and made incident on the light-receiving segment of the light-receiving element 107 of the semiconductor laser device 120.

When mounting the semiconductor laser device 120 on the mounting portion of the optical pickup device, the semiconductor laser device 120 is turned for adjusting the mounting position so that the three beams are appropriately condensed onto three pit lines 138a, i.e., the tracks on the optical disk 138, and thereafter fixed to this mounting plate 132.

However, the aforementioned prior art semiconductor laser devices 110, 120 and 125 have a problem that the devices tend to become loose when turned for adjusting the mounting position on the mounting plate 132. In more detail, when turning the semiconductor laser devices 110, 120 and 125, the mounting reference surface 101a is turned while being fit close to the mounting surface 132a of the mounting plate 132. However, the mounting reference surface 101a, which is the surface other than the welded portion of the end surface of the base 101 to which the flange portion 110b of the cap 110 is welded, has a very small area. Therefore, the area of contact of this reference surface 101a with the mounting surface 132a is very small. Therefore, when the semiconductor laser devices 110, 120 and 125 are turned, the direction of the semiconductor laser devices 110, 120 and 125 with respect to the mounting plate 132 becomes disadvantageously unstable and loose. As a result, there is the problem that the mounting accuracy of the semiconductor laser devices 110, 120 and 125 with respect to the optical pickup device is poor.

SUMMARY OF THE INVENTION

Accordingly, the object of the present invention is to provide a semiconductor laser device capable of being easily accurately mounted on the mounting portion of an optical pickup device.

In order to accomplish the above object, the present invention provides a semiconductor laser device comprising:

- a semiconductor laser element;
- a metallic base for mounting the semiconductor laser element and supporting wiring leads via insulators; and
- a cap that is provided with an opening through which light from the semiconductor laser element is emitted, and the cap being fixed to the base by welding with the semiconductor laser element housed therein,
- the cap having a skirt portion extended from part of its peripheral surface, and the skirt portion being fixed by welding to a side surface of the base other than its end surface that serves as a mounting reference surface for the semiconductor laser device.

According to the above construction, the skirt portion of the cap is fixed by welding to the surface that belongs to the base and is other than the end surface. Therefore, no flange of the cap is welded to the end surface that serves as the mounting reference surface of the base, dissimilarly to the conventional case. Therefore, the end surface of the base in the state in which the cap is fixed to the base has an area larger than that in the conventional case. That is, the area of the mounting reference surface for mounting this semiconductor laser device on the mounting portion of the optical pickup device is larger than in the conventional case. Therefore, an area of contact of the mounting reference surface with the surface of the portion for mounting this semiconductor laser device becomes larger than in the conventional case. As a result, even if the semiconductor laser device is turned in a state in which the mounting reference surface is made to abut against the surface of the mounting portion of the optical pickup device so as to adjust the mounting position of this semiconductor laser device, the semiconductor laser device does not become loose. With this arrangement, the accuracy in mounting the semiconductor laser device on the mounting portion is improved.

In an embodiment, a recess portion is formed on the side surface of the base, a projection is provided in the recess portion, the skirt portion is inserted into the recess portion, the inserted skirt portion is welded to the projection inside the recess portion, and the cap is fixed to the base.

According to the above embodiment, the skirt portion of the cap is inserted into the recess portion formed on the side surface of the base, and therefore, the portion of the cap does not project outwardly of the side surface of the base. Therefore, this semiconductor laser device becomes compact since there is no portion that is projecting outwardly of the base.

Moreover, the cap is fixed by inserting the skirt portion extended from part of the peripheral surface of the cap into the recess portion located on the side surface of the base. Therefore, by finely adjusting the length of insertion of the skirt portion into the recess portion, a distance between the base and the top surface of the cap is accurately determined. Therefore, if this semiconductor laser device is of a hologram laser system such that the hologram element is provided at the top surface of the cap, the distance between the semiconductor laser element of the base and the hologram element of the cap is accurately determined, and the mounting accuracy of the hologram element is improved. Moreover, since the recess portion to which the skirt portion of the cap is fixed is provided on the side surface of the base. Therefore, even if the thickness of welding for fixing this skirt portion to the recess portion is varied, the distance between the base and the top surface of the cap does not vary. Therefore, the distance between the semiconductor laser element and the hologram element is reliably determined with high accuracy.

Furthermore, the skirt is welded to the projection provided in the recess portion, and therefore, the welding portion is smaller than the portion to be welded to the entire surface of the recess portion. Therefore, the influence of welding distortion and the like on the base and the cap becomes reduced.

In an embodiment, a recess portion is formed on a side surface of the base, a projection being provided in the recess portion,

- a resin lead block that is constructed by implanting wiring leads in an insulating resin and has a through hole,
- the resin lead block is arranged in the recess portion of the base, with the projection inside the recess portion penetrating the through hole, and
- the skirt portion of the cap is welded to an end surface of the projection.

According to the above embodiment, the skirt portion of the cap is welded to the projection of the base that penetrates the through hole of the resin lead block, fixing the base, the resin lead block and the cap. Therefore, it is not required to weld the flange portion of the cap to the end surface of the base, dissimilarly to the conventional case. Therefore, the area of the mounting reference surface formed on the end surface of the base becomes larger than in the conventional case, and the mounting position of the semiconductor laser device is stably adjusted without becoming loose when the semiconductor laser device is mounted on, for example, an optical pickup device. Furthermore, the plurality of wiring leads are attached to the base only by providing the resin lead block in the recess portion of the base. Therefore, a semiconductor laser device is easily manufactured at a lower cost than when a plurality of leads are individually attached to the base via insulators.

In an embodiment, the welding is resistance welding.

According to the above embodiment, the base and the cap are fixed easily and firmly by the resistance welding.

In an embodiment, the projection has a sharp end portion.

According to the above embodiment, the projection to which the skirt portion of the cap is welded has the sharp end portion. Therefore, the position in which the projection and the skirt portion come in contact with each other before being welded becomes approximately constant without variation. Therefore, the welding position becomes approximately constant. Moreover, the area of contact of the sharp end portion of the projection and the skirt portion also becomes approximately constant without variation. Therefore, for example, the density of a current that flows through the contact portion during the resistance welding also becomes approximately constant. Therefore, the area of the portion to be welded by the welding, the depth of melting of the material to be welded and so on become approximately constant, by which the skirt portion of the cap and the base are welded together with a specified quality free of variation. As a result, satisfactory welding, which ensures a specified strength, is stably obtained.

In an embodiment, the base has a length in a lengthwise direction and a length in a widthwise direction, the lengths being different from each other.

According to the above embodiment, by welding the skirt portion of the cap to the side surface of the base in the lengthwise direction whose length is different from that of widthwise direction, the welded portions of the base and the cap are allowed to be located in an appropriate position and have an appropriate area. Therefore, the base and the cap are easily welded together with an appropriate strength.

In an embodiment, the mounting reference surface for the semiconductor laser device is arranged at both ends in the lengthwise direction of the base.

According to the above embodiment, the mounting reference surface arranged at both ends in the lengthwise direction of the base, of which the distance between the reference surfaces located at both ends is greater than when the reference surface is arranged at both ends in the direction of the short side of the base, becomes stable with respect to a large moment force. Therefore, even if the semiconductor laser device is turned in order to adjust the mounting position of the semiconductor laser device in a state in which the reference surface abut against the mounting surface of the semiconductor laser device, the semiconductor laser device does not becomes loose. As a result, the mounting position of the semiconductor laser device is determined easily and reliably.

In an embodiment, two or more welded portions are provided in positions symmetrical with respect to an axis in the lengthwise direction of the base.

According to the above embodiment, two or more welded portions are provided in positions symmetrical with respect to the axis in the lengthwise direction of the base, and therefore, the cap is reliably fixed to the base with a specified strength.

The present invention also provides an optical pickup device provided with the semiconductor laser device of the present invention.

According to the above construction, the semiconductor laser device is easily mounted on the mounting portion of the optical pickup device with the specified mounting accuracy. Therefore, a thin type optical pickup device having a satisfactory performance is easily manufactured.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

Figure 1A:
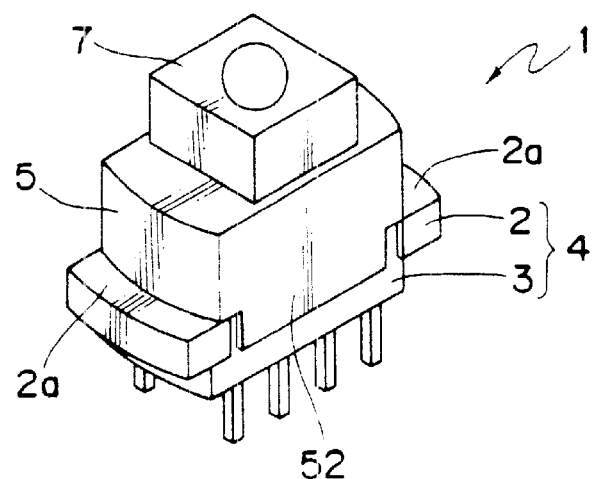
FIG. 1A is a perspective view showing a semiconductor laser device according to a first embodiment of the present invention.

The present invention will be described in detail below on the basis of the embodiments thereof shown in the drawings.

Figure 1B:
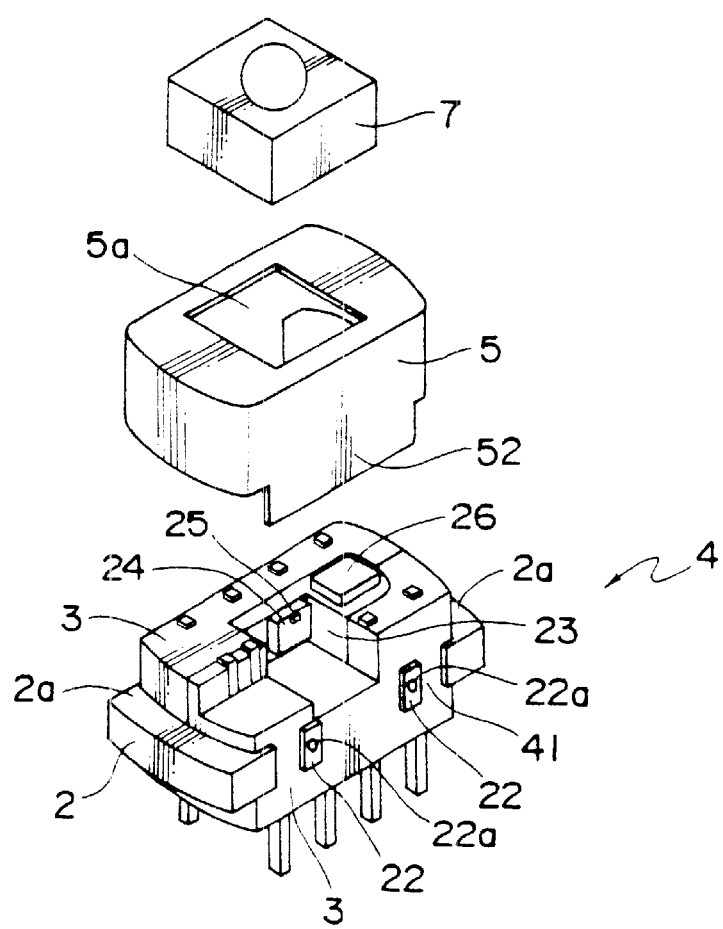
FIG. 1B is an exploded perspective view of the semiconductor laser device.

FIG. 1A is a perspective view showing a semiconductor laser device according to the first embodiment of the present invention. FIG. 1B is an exploded perspective view showing this semiconductor laser device. This semiconductor laser device 1 is constituted of a stem 4 constructed of a base 2 and two resin lead blocks 3 and 3 arranged on both sides of the base 2, a cap 5 that covers the upper side of this stem 4 and a hologram element 7 arranged in an opening 51 provided at the upper surface of the cap 5.

Figure 2:
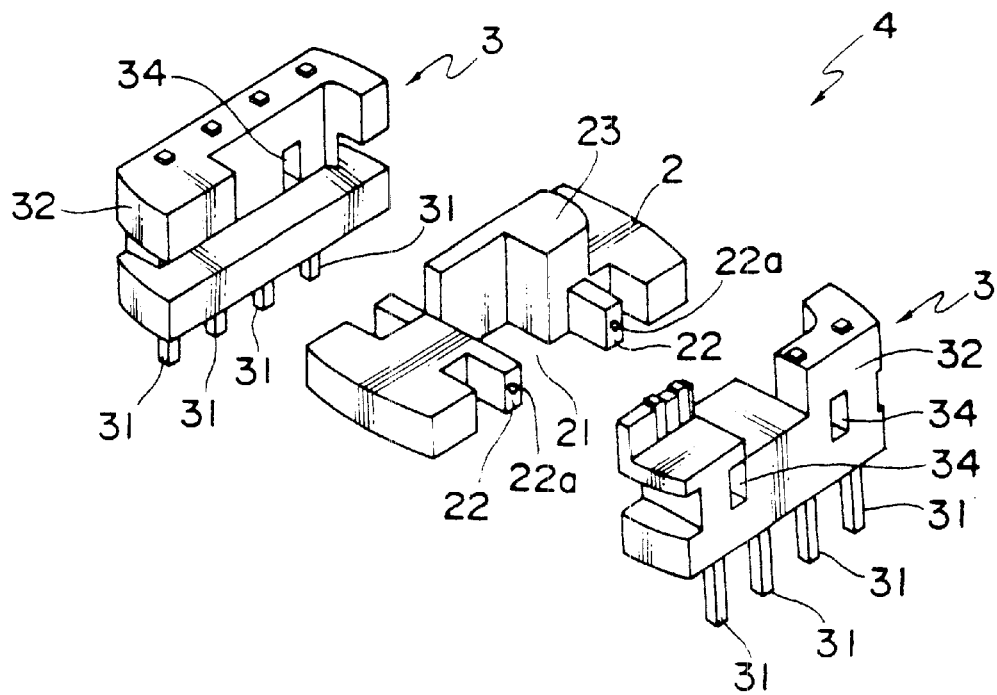
FIG. 2 is an exploded perspective view of a stem 4 of the semiconductor laser device shown in FIGS. 1A and 1B.
Figure 3A:
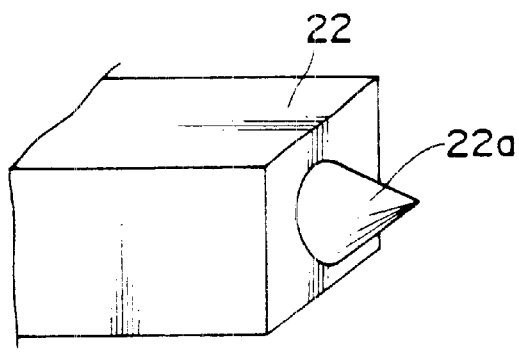
FIGS. 3A and 3B are enlarged views of end portions of projections 22 of a base 2.
Figure 3B:
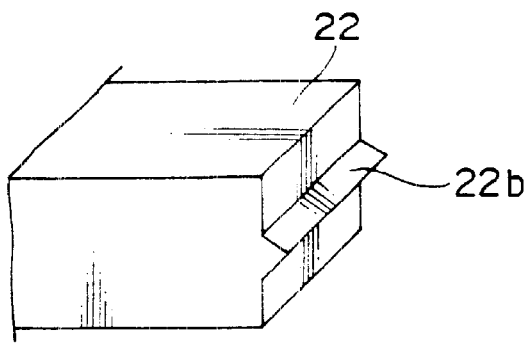

FIG. 2 is an exploded perspective view of the stem 4. As shown in FIG. 2, the base 2 made of copper has recess portions 21 and 21 on the side surfaces of the opposed two long sides thereof. The recess portions 21 and 21 are provided with two projections 22 and 22 that extend in the direction of the short side of the base inside the recess portions 21 and 21. A generally cone-shaped protrusion 22a as shown in FIG. 3A is provided on the end surface of each projection 22. Alternatively, an edged portion 22b may be used which extends in the widthwise direction as shown in FIG. 3B. What is important is that the projection 22 has a sharp portion on the end surface.

As shown in FIG. 2, the resin lead blocks 3 are each constituted of four wiring leads 31, 31, 31 and 31 and a resin block 32 in which the wiring leads 31, 31, 31 and 31 are implanted, and the resin block 32 is provided with two through holes 34 and 34.

Then, the stem 4 is formed by arranging the resin lead blocks 3 and 3 in the recess portions 21 and 21 of the base 2 and making the projections 22 and 22 of the base 2 penetrate the through holes 34 and 34 of the resin lead blocks 3 and 3. As shown in FIG. 1B, recess portions 41 and 41 are formed on the peripheral surfaces which belong to the stem 4 and in which the resin lead blocks 3 and 3 are arranged, and the tip portions of the projections 22 and 22 are projecting in the recess portions 41 and 41.

A heat sink 23 is formed integrally with the base 2, and a semiconductor laser element 25 is mounted on a side surface of this heat sink 23 via a submount 24. A light-receiving element 26 for signal detection use is mounted on the upper surface of the heat sink 23. Then, pads (not shown) of the semiconductor laser element 25 and the light-receiving element 26 are connected to the wiring leads 31 of the resin lead blocks 3 and 3 by wire bonding (not shown).

The cap 5 has skirt portions 52 and 52 extended from parts of the peripheral surfaces of the lengthwise sides. The skirt portions 52 and 52 are inserted into the recess portions 41 and 41 of the stem 4, and the tip portions of the projections 22 and 22 that are projecting in the recess portions 41 and 41 are joined to the inner surfaces of the skirt portions 52 by resistance welding.

Figure 4:
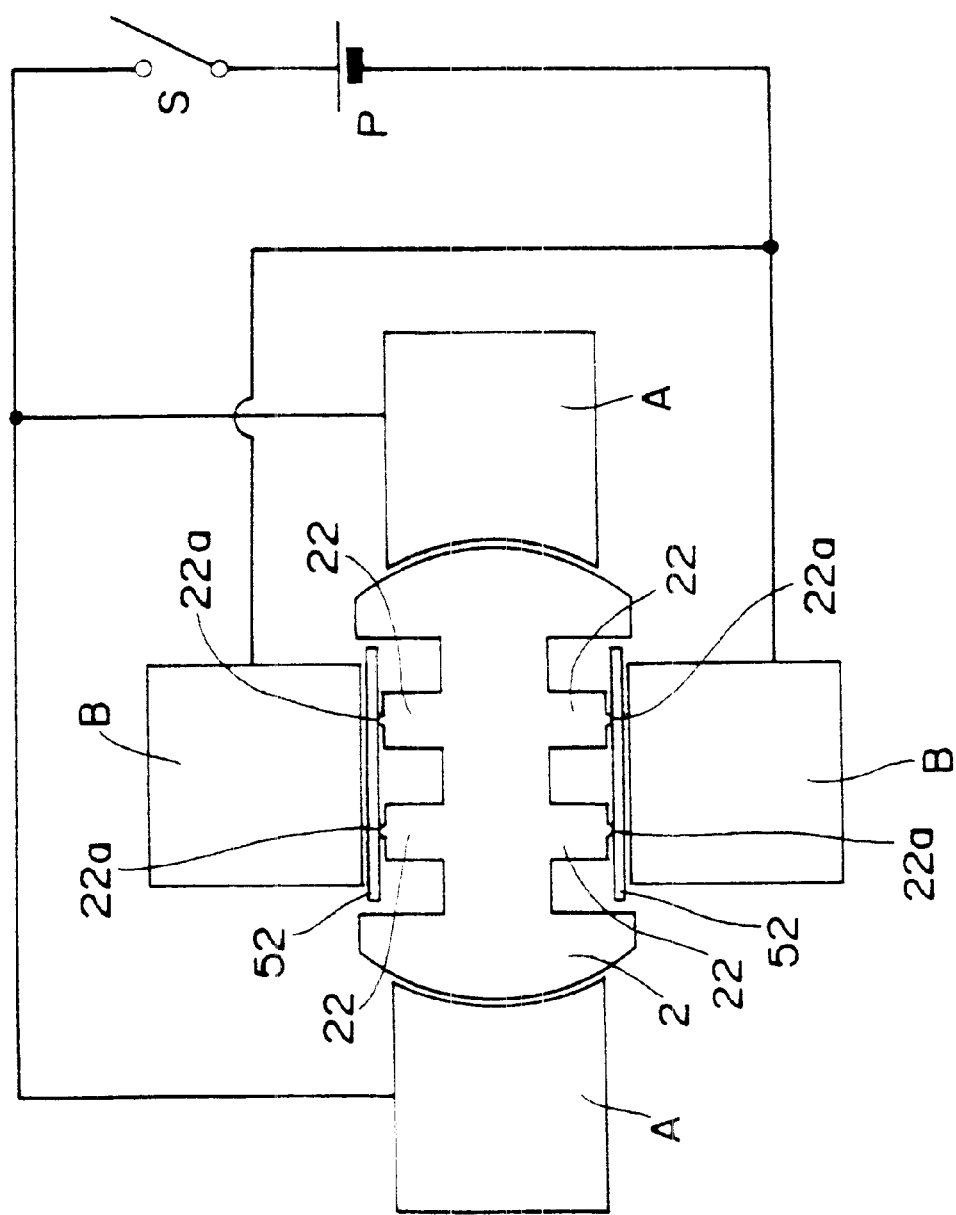
FIG. 4 is a schematic sectional view showing a state in which the projections 22 and 22 of the base 2 are resistance-welded to the skirt portions 52 of a cap 5.

FIG. 4 is a schematic sectional view showing a state in which the projections 22 and 22 of the base 2 and the skirt portions 52 and 52 of the cap 5 are resistance-welded together. First of all, surfaces of the short sides of the base 2 are fixed by electrodes A and A. Subsequently, the outer surfaces of the skirt portions 52 and 52 located on both sides of the cap 5 are inwardly pressurized with a specified pressure by electrodes B and B. At this time, the roughly cone-shaped protrusions 22*a* and 22*a* provided on the end surfaces of the projections 22 and 22 are pressurized by the inner surfaces of the skirt portions 52 and 52. So that the protrusions 22*a* and 22*a* and the inner surface of the skirt portions 52 and 52 come to have specified contact areas. Next, a switch S is turned on to connect the electrodes A and A and the electrodes B and B to a power source P, forming currents between the electrodes A and A and the electrodes B and B. Then, the contact portions of the protrusions 22*a* of the projections 22 and the skirt portions 52 generate heat, and the metal in the contact portions melt to weld the projections 22 to the skirt portions 52 of the cap 5.

Since the roughly cone-shaped protrusions 22*a* are provided on the end surfaces of the projections 22, the position and the area of contact of each protrusion 22*a* with the inner surface of the skirt portion 52 become constant. Consequently, the resistance welding of a specified intensity is reliably performed in the specified positions of the projections 22 and the skirt portions 52, and this enables the resistance welding of a stabilized quality to be provided without variation.

Figure 10A:
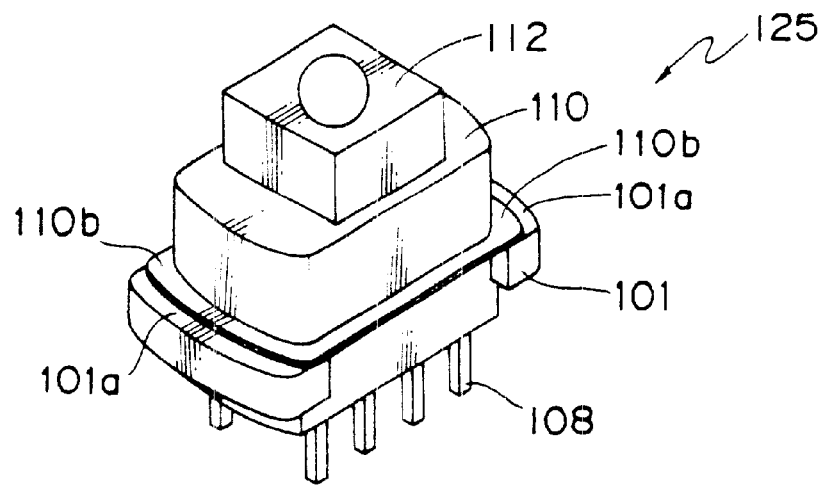
FIG. 10A is a perspective view showing a prior art semiconductor laser device.
Figure 10B:
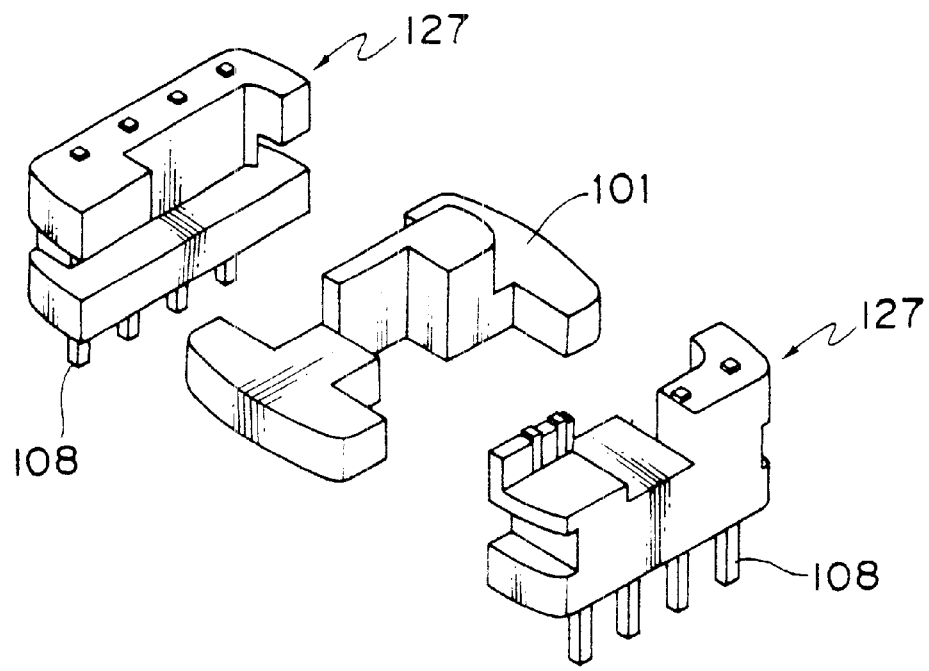
FIG. 10B is an exploded perspective view of the base 101 and the resin lead blocks 127 and 127 of the prior art semiconductor laser device.
Figure 11:
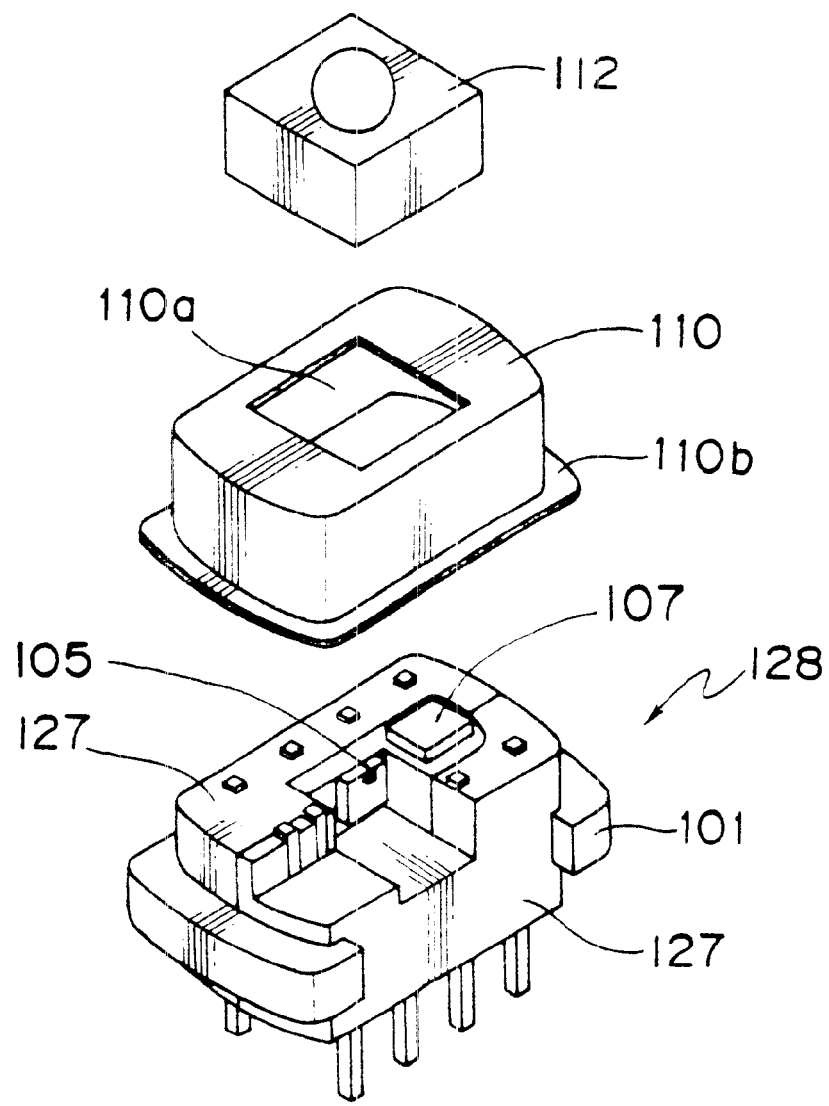
FIG. 11 is an exploded perspective view of the semiconductor laser device of FIG. 10A.

The welding portions among the base 2 and the cap 5 are located on the peripheral surfaces of the base 2, and this means that no flange portion of the cap is welded to the end surfaces of the base dissimilarly to the prior art semiconductor laser device shown in FIGS. 10A and 10B. With this arrangement, roughly the entire end surface of the base 2 can be used as the mounting reference surface 2*a* for mounting this semiconductor laser device 1 on the mounting portion of the optical pickup device.

Moreover, the resistance welding is performed on the peripheral surfaces of the cap 5 and the base 2. Therefore, the distance between the top surface of the cap and the end surface of the base does not vary dissimilarly to such conventional case as the variation of the thickness of the welding between the flange of the cap and the end surface of the base resulted in the variation of the distance between the top surface of the cap and the end surface of the base.

Therefore, the distance between the hologram element provided on the top surface of the cap 5 and the semiconductor laser element provided on the base can be accurately set to a specified distance without receiving the influence of welding.

Moreover, the projections 22 of the base 2 and the skirt portions 52 of the cap 5 are resistance-welded together. Therefore, the welding area can be made smaller than when, for example, the entire peripheral surface of the base is welded to the cap, by which the influence of welding distortion and the like on the base and the cap can be reduced.

Figure 12:
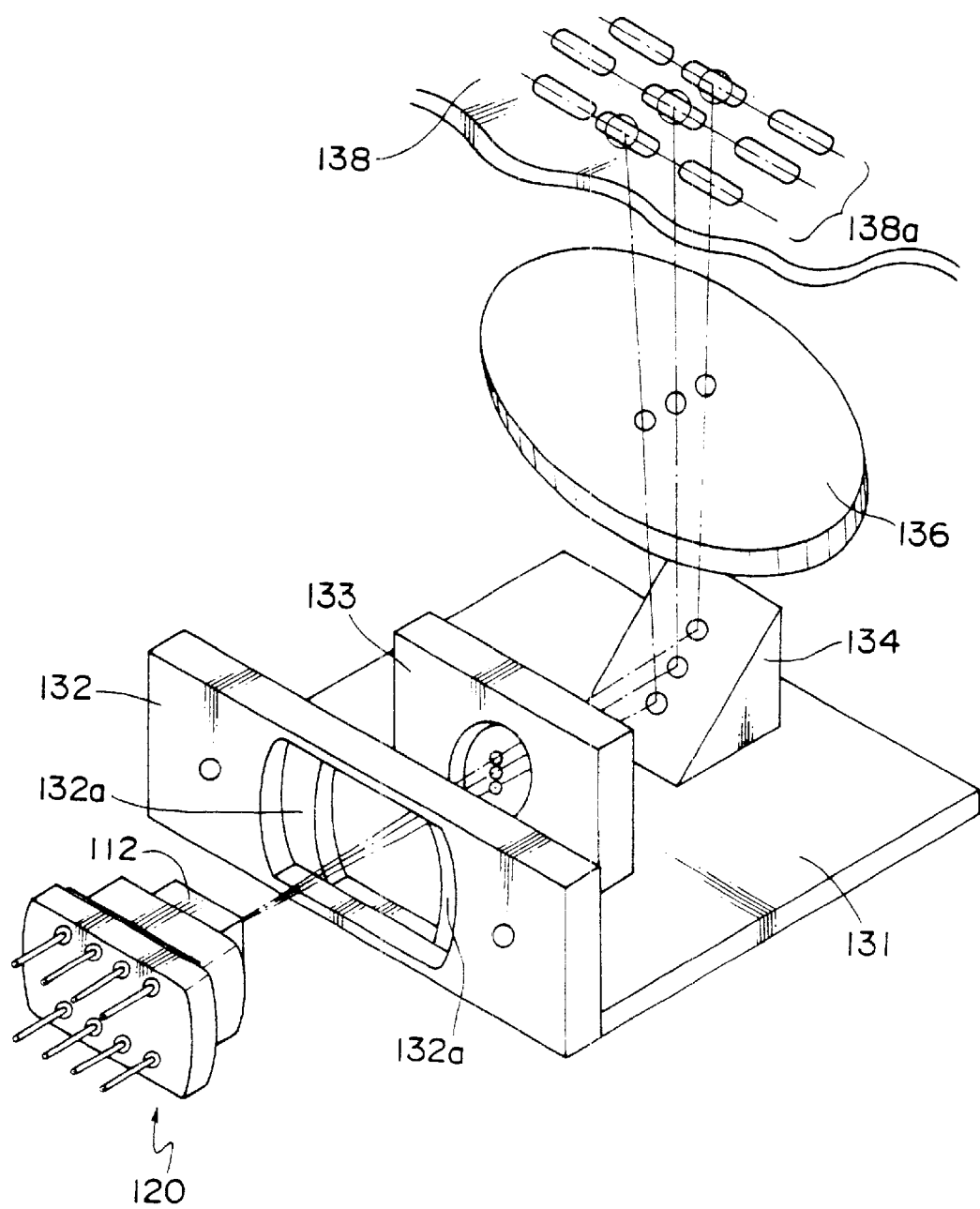
FIG. 12 is a view showing an optical pickup device that employs the semiconductor laser device 120 shown in FIGS. 9A and 9B.

An optical pickup device according to the present invention is formed by employing the semiconductor laser device 1. Also, in the optical pickup device of the present invention, the semiconductor laser device 1 is assembled with an assembly plate 131 via a mounting plate 132, similarly to the optical pickup device shown in FIG. 12. When mounting the semiconductor laser device 1 on the mounting plate 132, the semiconductor laser device 1 is turned to adjust the mounting position on the mounting plate 132 so that three beams emitted from the hologram element 7 of the semiconductor laser device 1 are appropriately condensed onto the three tracks on the optical disk 138. At this time, the semiconductor laser device 1 is turned with the mounting reference surface 2*a* of the semiconductor laser device 1 made to abut against the mounting surface 132*a* of the mounting plate 132. No flange portion of the cap is welded to the end surface of the semiconductor laser device 1 dissimilarly to the conventional case, and therefore, roughly the entire surface of the end surface that serves as the reference surface 2*a* can be made to abut against the mounting surface 132*a*. That is, the reference surface 2*a* of which area is larger than the area of the conventional case can be turned while abutting against the mounting surface 132*a*. Therefore, the semiconductor laser device 1 can be reliably set in the specified position without becoming loose. As a result, a thin type optical pickup device of a satisfactory performance can easily be manufactured.

Figure 5A:
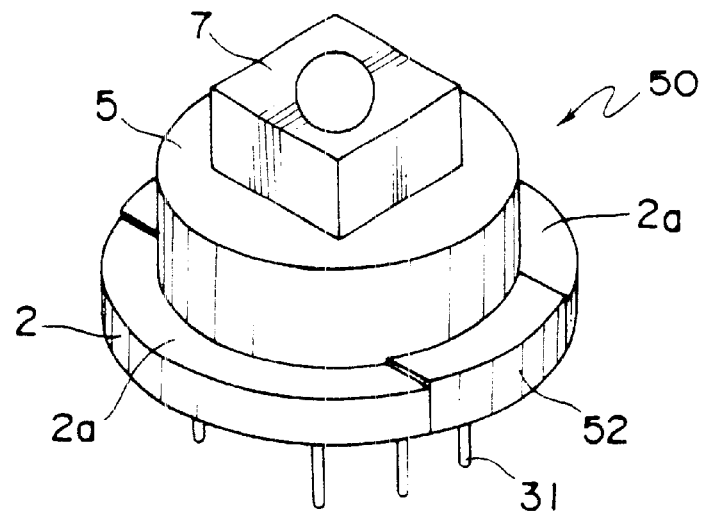
FIG. 5A is a perspective view showing a semiconductor laser device according to a second embodiment of the present invention.
Figure 5B:
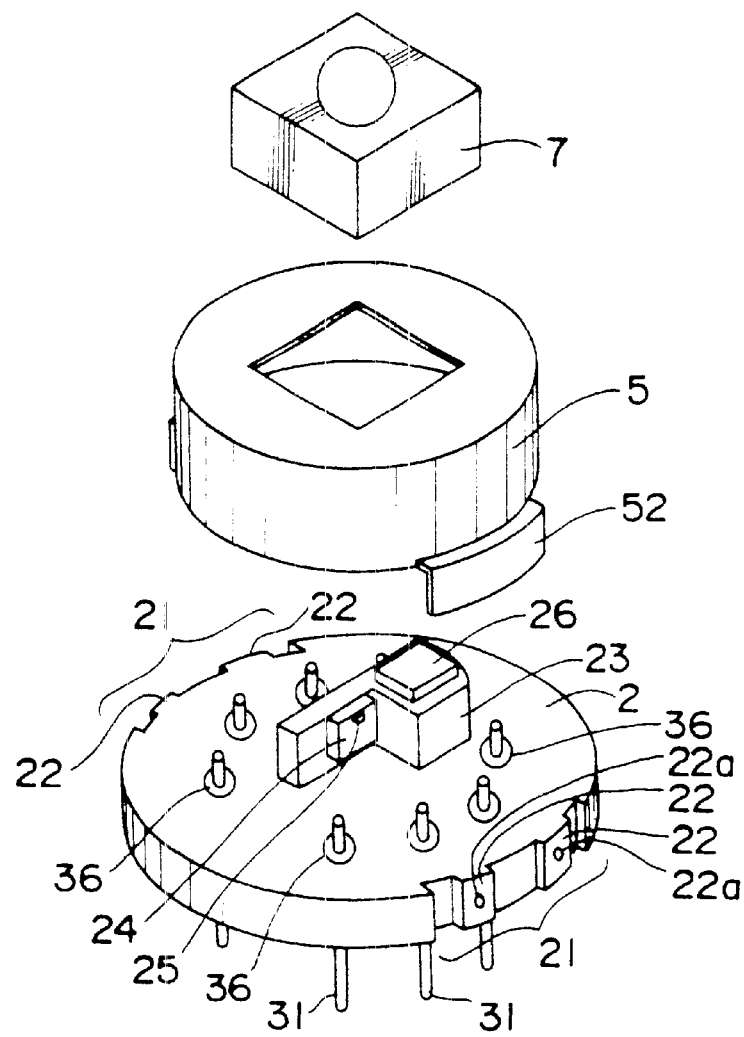
FIG. 5B is an exploded perspective view of the semiconductor laser device.

FIG. 5A is a perspective view showing a semiconductor laser device according to the second embodiment of the present invention, while FIG. 5B is an exploded perspective view of the semiconductor laser device. In FIGS. 5A and 5B, the same portions as those of the semiconductor laser device 1 shown in FIGS. 1A and 1B are denoted by the same reference numerals, and no description is provided for the portions. This semiconductor laser device 50 has the same construction as that of the prior art semiconductor laser device 100 shown in FIGS. 8A and 8B except that the cap 5 has skirt portions 52 and 52 with no flange portion provided and the base 2 has projections 22 formed in recess portions 21 and 21.

In this semiconductor laser device 50, the base 2 and the cap 5 are roughly circular in shape, and a plurality of leads 31, 31, . . . are fixed to the base 2 via hermetic seals 36, 36, . . . Further, two recess portions 21 and 21 are provided in point-symmetry positions of the circle of the base on the peripheral surface of the base 2. Two projections 22 and 22 are provided in each recess portion 21. On the other hand, the cap 5 has two skirt portions 52 and 52 formed by extending parts of the peripheral surface thereof and bending the extended portions. The skirt portions 52 and 52 are inserted into the recess portions 21 and 21 located on the side surface of the base 2, and the projections 22 and 22 of each recess portion 21 and the skirt portions 52 are resistance-welded together, fixing the cap 5 and the base 2. A roughly cone-shaped protrusion 22a is provided on the end surface of each projection 22, by which the resistance-welded portions of the projections 22 and 22 and the skirt portions 52 stably come to be located in the specified positions and have a specified strength, similarly to the semiconductor laser device 1 shown in FIGS. 1A and 1B.

Figure 8A:
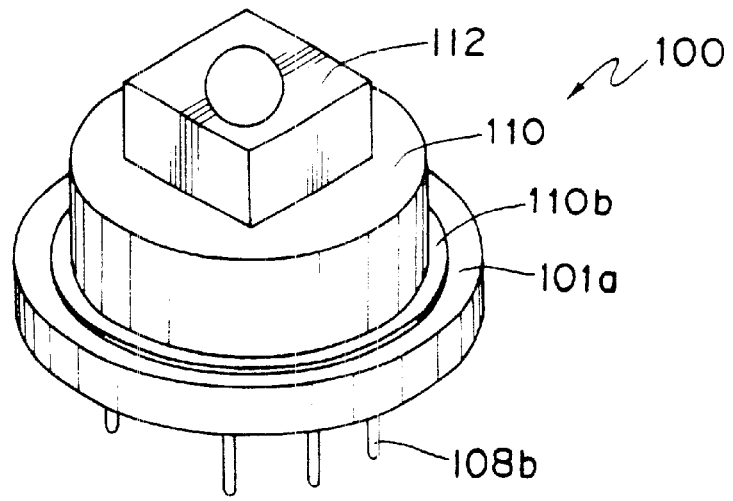
FIG. 8A is a perspective view showing a prior art semiconductor laser device.
Figure 8B:
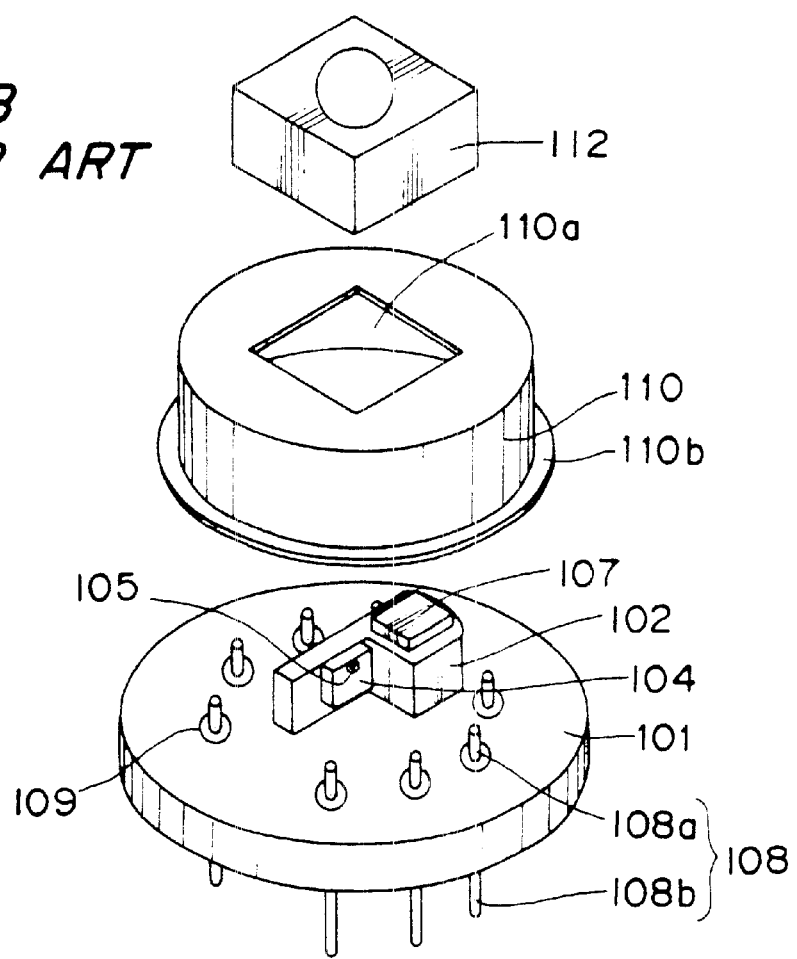
FIG. 8B is an exploded perspective view of the prior art semiconductor laser device.

This semiconductor laser device 50, in which no flange portion of the cap is fixed to the end surface of the base 2 dissimilarly to the prior art semiconductor laser device of FIGS. 8A and 8B, also has a mounting reference surface 2a of which area is larger than that of the conventional case. As a result, the mounting position of the semiconductor laser device 50 can be stably adjusted, and this enables an optical pickup device of a satisfactory performance to be easily manufactured.

Figure 6A:
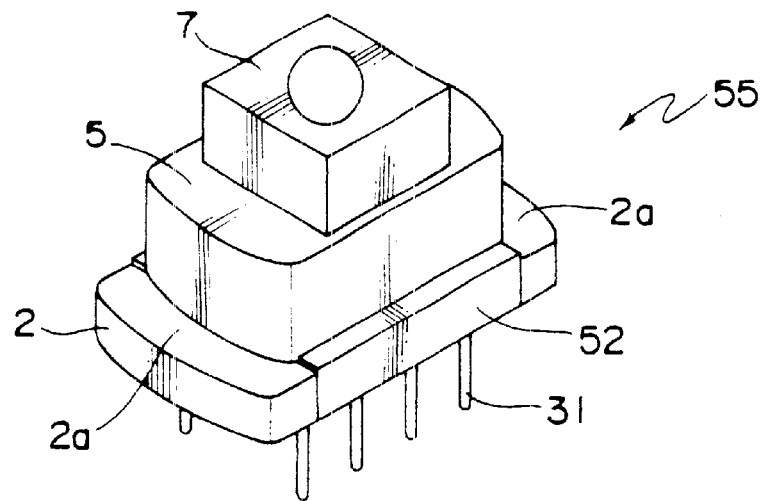
FIG. 6A is a perspective view showing a semiconductor laser device according to a third embodiment of the present invention.
Figure 6B:
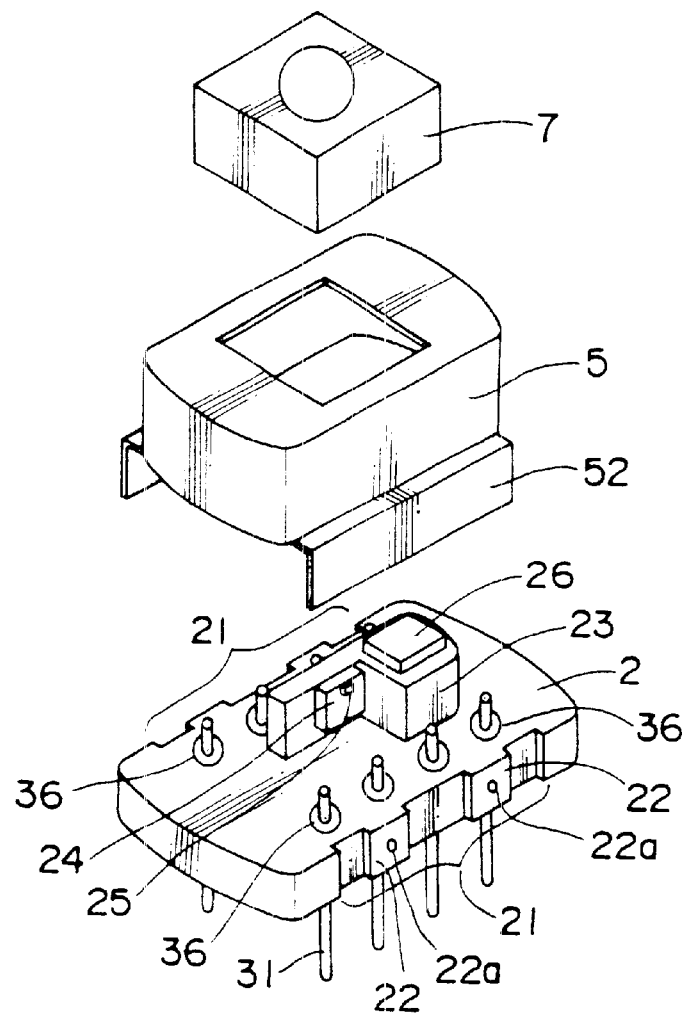
FIG. 6B is an exploded perspective view of the semiconductor laser device.
Figure 9A:
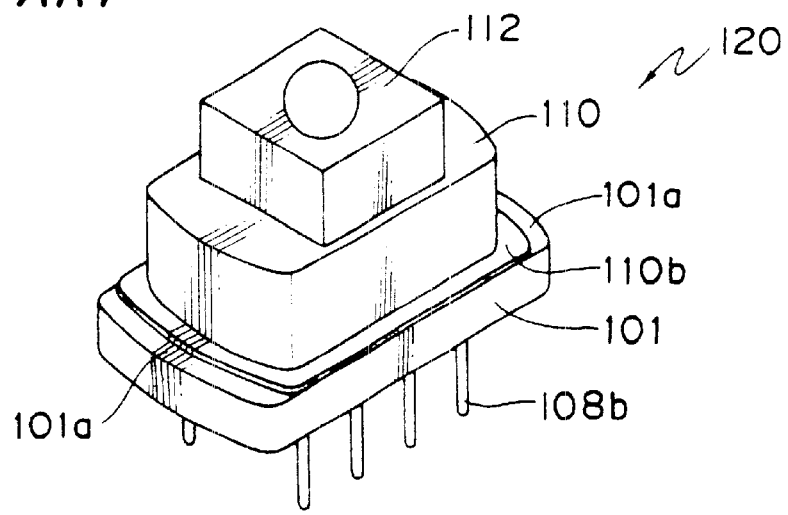
FIG. 9A is a perspective view showing a prior art semiconductor laser device.
Figure 9B:
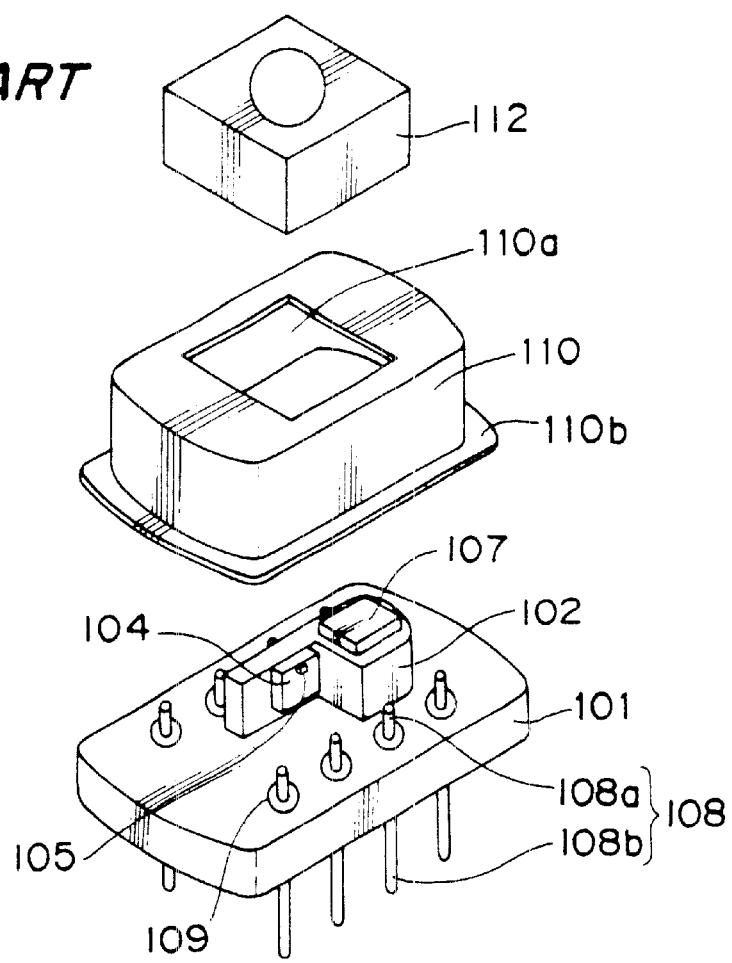
FIG. 9B is an exploded perspective view of the prior art semiconductor laser device.

FIG. 6A is a perspective view showing a semiconductor laser device according to the third embodiment of the present invention, while FIG. 6B is an exploded perspective view of the semiconductor laser device. In FIGS. 6A and 6B, the same portions as those of the semiconductor laser device 1 shown in FIGS. 1A and 1B are denoted by the same reference numerals. This semiconductors laser device 55 has the same construction as that of the prior art semiconductor laser device 120 shown in FIGS. 9A and 9B except that the cap 5 has skirt portions 52 with no flange portion provided and the base 2 has projections 22 and 22 formed in recess portions 21 and 21.

In this semiconductor laser device 55, the base 2 and the cap 5 have elliptic shapes. Two recess portions 21 and 21 are formed opposite to each other on the side surfaces of the long sides of the base 2. Two projections 22 and 22 are provided in each recess portion 21. On the other hand, the cap 5 has two skirt portions 52 and 52 formed by extending part of the peripheral surfaces thereof and bending the extended portions. The skirt portions 52 and 52 are inserted into the recess portions 21 and 21 of the base 2, and the projections 22 and 22 of each recess portions 21 and the skirt portions 52 are resistance-welded together, fixing the cap 5 and the base 2. A roughly cone-shaped protrusion 22a is provided on the end surface of each projection 22, by which the resistance-welded portions of the projections 22 and 22 and the skirt portions 52 stably come to be located in the specified positions and have a specified strength, similarly to the semiconductor laser device 1 shown in FIGS. 1A and 1B.

This semiconductor laser device 55, in which no flange portion of the cap is fixed to the end surface of the base 2 dissimilarly to the prior art semiconductor laser device of FIGS. 8A and 8B, also has a mounting reference surface 2a of which area is larger than the conventional case. As a result, the mounting position of the semiconductor laser device 55 can be stably adjusted, and this enables an optical pickup device of a satisfactory performance to be easily manufactured.

Figure 7A:
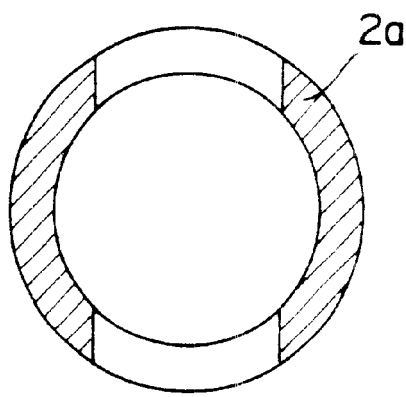
FIGS. 7A, 7B, 7C, and 7D are views showing examples of mounting reference surfaces of the semiconductor laser devices of the present invention.
Figure 7E:
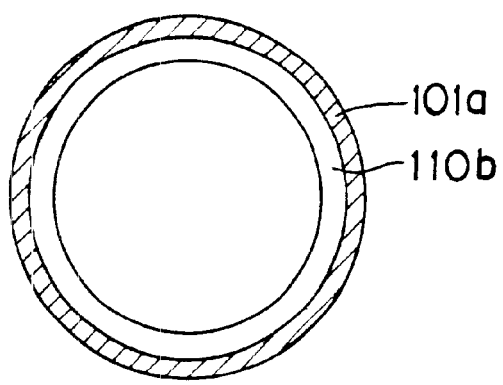
FIGS. 7E, 7F, 7G and 7H are views showing examples of conventional mounting reference surfaces to be compared with the mounting reference surfaces shown in FIGS. 7A, 7B, 7C, and 7D.

FIGS. 7A and 7E are views for comparing the semiconductor laser device of the present invention that has a circular base with the prior art semiconductor laser device with regard to the shapes of the mounting reference surfaces. As is apparent from FIG. 7E, the conventional mounting reference surface 101a is an annular zone of a comparatively small width along the periphery of the base. In contrast to this, the mounting reference surface 2a of the second embodiment of the present invention shown in FIG. 7A is constructed of two arc-shaped zones that has a comparatively great width and oppose to each other in the point-symmetry positions. In this case, the reference surfaces of the prior art and the second embodiment have approximately the same area of contact with the mounting surface on which the semiconductor laser device is mounted. Therefore, the degree of stability with respect to the mounting surface of the semiconductor laser device is approximately the same.

Figure 7B:
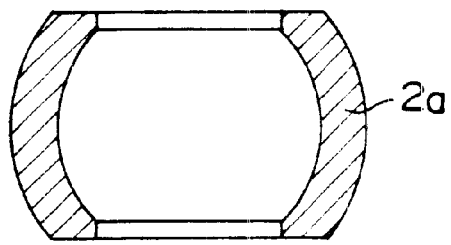
Figure 7F:
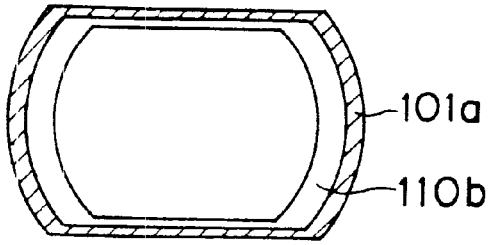

FIGS. 7B and 7F are views for comparing the semiconductor laser device of the present invention that has an elliptic base with the prior art semiconductor laser device with regard to the shapes of the mounting reference surfaces. As is apparent from FIG. 7F, the conventional mounting reference surface 101a is an elliptic zone of a comparatively small width along the periphery of the base. In contrast to this, the mounting reference surface 2a of the third embodiment of the present invention shown in FIG. 7B is constructed of two arc-shaped zones of a comparatively great width located on both end portions in the lengthwise direction. In this case, the conventional reference surface 101a has a reference surface in the portion of the chord located on both sides in the direction of the short side of the elliptic shape. The reference surface in the portion of this chord has a comparatively small width, and the reference surface located on both sides in the lengthwise direction also has a comparatively small width. When turning the semiconductor laser device with the reference surface of the semiconductor laser device made to abut against the mounting surface, the reference surface located at both end portions in the lengthwise direction has a greater effect of stabilizing the semiconductor laser device than the reference surface located at both end portions in the direction of the short side. The above is because a distance between both the end portions in the lengthwise direction is greater, and therefore, the value of the resistive moment is also greater in proportion to the distance. Therefore, the reference surface 2a of the third embodiment that has large areas in both end portions in the lengthwise direction can more reliably stabilize the semiconductor laser device than the conventional reference surface 101a when adjusting the position of the semiconductor laser device.

Figure 7C:
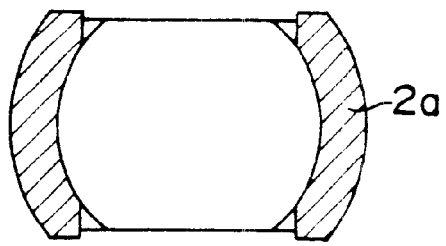
Figure 7G:
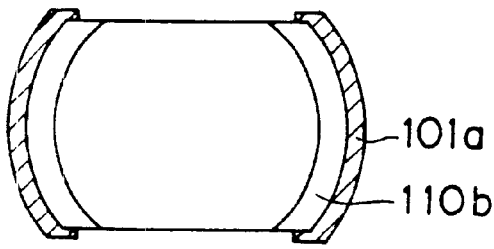

FIGS. 7C and 7G are views for comparing the semiconductor laser device of the present invention that has the resin lead blocks with the prior art semiconductor laser device with regard to the shapes of the mounting reference surfaces. As is apparent from FIG. 7G, the conventional mounting reference surface 101a has two arc-shaped zones of a small width in both end portions in the lengthwise direction of the base. In contrast to this, the mounting reference surface 2a of the first embodiment of the present invention shown in FIG. 7C has two arc-shaped zones of a comparatively great width in both end portions in the lengthwise direction. Therefore, the reference surface 2a of the first embodiment that has large areas in both end portions in the lengthwise direction can more reliably stabilize the semiconductor laser device than the conventional reference surface 101a when adjusting the position of the semiconductor laser device.

Figure 7D:
Figure 7H:
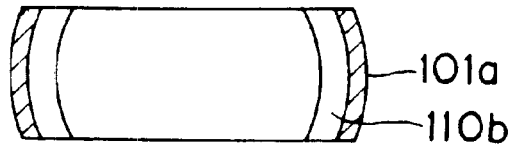

FIG. 7D is a view of a mounting reference surface 2a of a semiconductor laser devices obtained by modifying the semiconductor laser device shown in FIG. 7C in order to cope with a thin type optical pickup device with a reduced width in the direction of the short side. FIG. 7H in a view of a mounting reference surface 101a of a conventional thin type semiconductor laser device. As is apparent from FIG. 7D, the reference surface 2a of the present invention, in which the flange portion 110b of the cap is not fixed to the end surface of the base dissimilarly to the conventional case, has an area greater than that of the conventional reference surface 101a which is adjacent to the flange portion part 110b of the cap. Furthermore, if the width in the direction of the short side is reduced, a difference in area between the conventional reference surface 101a and the reference surface 2a of the present invention is increased. Therefore, in the case of the semiconductor laser devices that have the shapes of FIG. 7D, the reference surface 2a of the present invention can markedly stabilize the semiconductor laser device than the conventional reference surface 101a of FIG. 7H.

That is, the reference surface of the present invention can mount the semiconductor laser device on the mounting portion of the optical pickup device while effectively stabilizing the device particularly in the case of a semiconductor laser device that-has a small short side width.

Although the base 2 and the cap 5 are fixed by the resistance welding in the aforementioned embodiments, the base 2 and the cap may be fixed by another type of welding of, for example, laser welding.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A semiconductor laser device comprising:
   a semiconductor laser element;
   a metallic base for mounting the semiconductor laser element and supporting wiring leads via insulators; and
   a cap that is provided with an opening through which light from the semiconductor laser element is emitted, and the cap being fixed to the base by welding with the semiconductor laser element housed therein,
   the cap having a skirt portion extended from part of its peripheral surface, and the skirt portion being fixed by welding to a side surface of the base other than its end surface that serves as a mounting reference surface for the semiconductor laser device.

2. A semiconductor laser device as claimed in claim 1, wherein a recess portion is formed on the side surface of the base, a projection is provided in the recess portion, the skirt portion is inserted into the recess portion, the inserted skirt portion is welded to the projection inside the recess portion, and the cap is fixed to the base.

3. A semiconductor laser device as claimed in claim 1, wherein
   a recess portion is formed on the side surface of the base,
      a projection being provided in the recess portion,
   a resin lead block that is constructed by implanting wiring leads in an insulating resin and has a through hole,
   the resin lead block is arranged in the recess portion of the base, with the projection inside the recess portion penetrating the through hole, and
   the skirt portion of the cap is welded to an end surface of the projection.

4. A semiconductor laser device as claimed in claim 2, wherein the welding is resistance welding.

5. A semiconductor laser device as claimed in claim 4, wherein the projection has a sharp end portion.

6. A semiconductor laser device as claimed in claim 1, wherein the base has a length in a lengthwise direction and a length in a widthwise direction, the lengths being different from each other.

7. A semiconductor laser device as claimed in claim 5, wherein the mounting reference surface for the semiconductor laser device is arranged at both ends in the lengthwise direction of the base.

8. A semiconductor laser device as claimed in claim 6, wherein two or more welded portions are provided in positions symmetrical with respect to an axis in the lengthwise direction of the base.

9. The semiconductor laser device of claim 1, wherein the semiconductor laser device comprises means for connection to and use in an optical pickup device.

10. A semiconductor laser device comprising:
    a semiconductor laser element;
    a base for mounting the semiconductor laser element and supporting wiring leads; and
    a cap that is provided with an opening through which light from the semiconductor laser element is emitted, and the cap being fixed to the base with the semiconductor laser element housed therein,
    the cap having a skirt portion extended from part of its peripheral surface, and the skirt portion being fixed to a side surface of the base other than its end surface that serves as a mounting reference surface for the semiconductor laser device.

* * * * *